(12) United States Patent
Oota

(10) Patent No.: US 8,420,966 B2
(45) Date of Patent: Apr. 16, 2013

(54) ELECTRONIC CONTROL APPARATUS

(75) Inventor: Shinsuke Oota, Kariya (JP)

(73) Assignee: DENSO CORPORATION, Kariya (JP)

( * ) Notice: Subject to any disclaimer, the term of this patent is extended or adjusted under 35 U.S.C. 154(b) by 273 days.

(21) Appl. No.: 12/905,305

(22) Filed: Oct. 15, 2010

(65) Prior Publication Data
US 2011/0090625 A1    Apr. 21, 2011

(30) Foreign Application Priority Data

Oct. 15, 2009  (JP) ................... 2009-238435
Sep. 2, 2010   (JP) ................... 2010-196749

(51) Int. Cl.
*H05K 7/20* (2006.01)
(52) U.S. Cl.
USPC .................. 200/302.1; 361/679.01
(58) Field of Classification Search ........... 361/730
See application file for complete search history.

(56) References Cited

U.S. PATENT DOCUMENTS

| | | | |
|---|---|---|---|
| 5,531,345 A | 7/1996 | Nakamura et al. | |
| 5,549,487 A | 8/1996 | Nortier | |
| 5,824,981 A | 10/1998 | Suzuki | |
| 6,982,379 B2 * | 1/2006 | Saka et al. | 174/50 |
| 7,719,833 B2 * | 5/2010 | Inagaki | 361/688 |
| 2003/0102143 A1 | 6/2003 | Sato et al. | |
| 2005/0138945 A1 * | 6/2005 | Schurig et al. | 62/279 |
| 2007/0230137 A1 | 10/2007 | Inagaki | |

FOREIGN PATENT DOCUMENTS

| | | |
|---|---|---|
| JP | 2000-247277 | 9/2000 |
| JP | 2002-152943 | 5/2002 |
| JP | 2004-356524 | 12/2004 |
| JP | 2004-357462 | 12/2004 |
| JP | 2005-137118 | 5/2005 |
| JP | 2009-219322 | 9/2009 |

OTHER PUBLICATIONS

Japanese Office Action dated Oct. 4, 2011, issued in corresponding Japanese Application No. 2010-196749 with English Translation.

* cited by examiner

*Primary Examiner* — Anthony Q Edwards
(74) *Attorney, Agent, or Firm* — Nixon & Vanderhye PC

(57) ABSTRACT

An electronic control apparatus includes a housing, a lid, a fastener, and a controller. The lid covers the opening of the housing to form a closed space defined by the lid and the housing. The fastener fixes the lid to the housing. The controller is located in the space. An isolation member is provided with an outer surface of one of the lid and the bottom of the housing. The outer surface has a liquid drip area where liquid is expected to drip. The isolation member causes the liquid dripped on the liquid drip area to flow down the outer surface in such a manner that the liquid avoids the fastener.

18 Claims, 13 Drawing Sheets

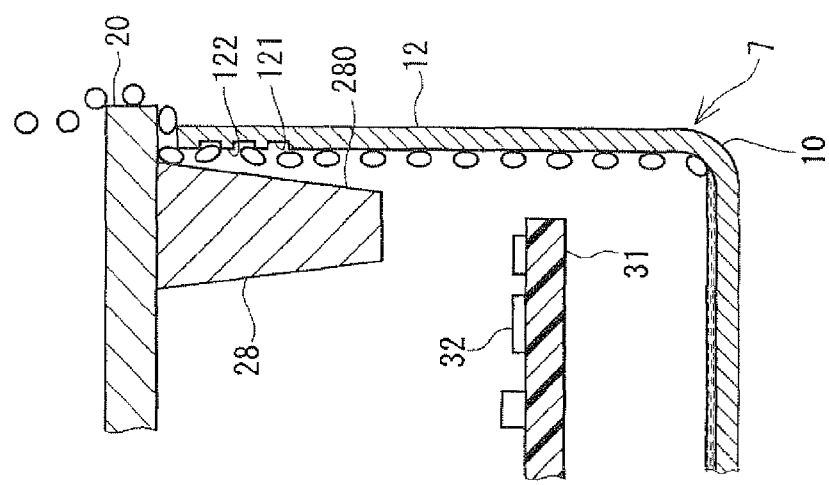
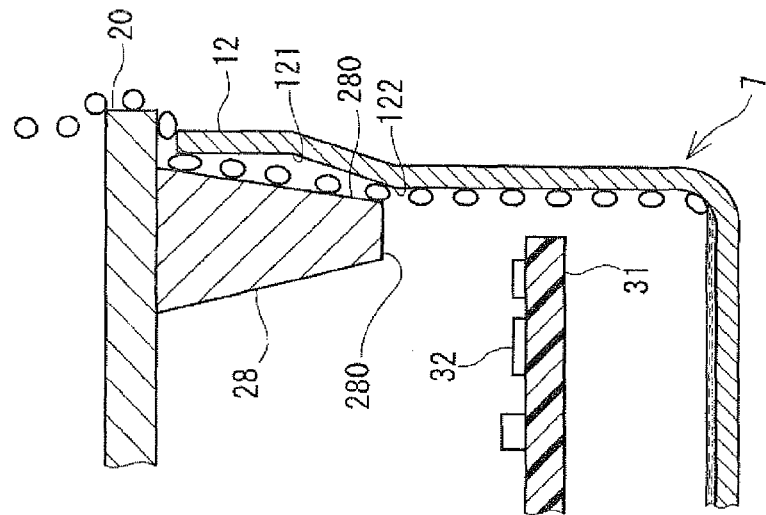
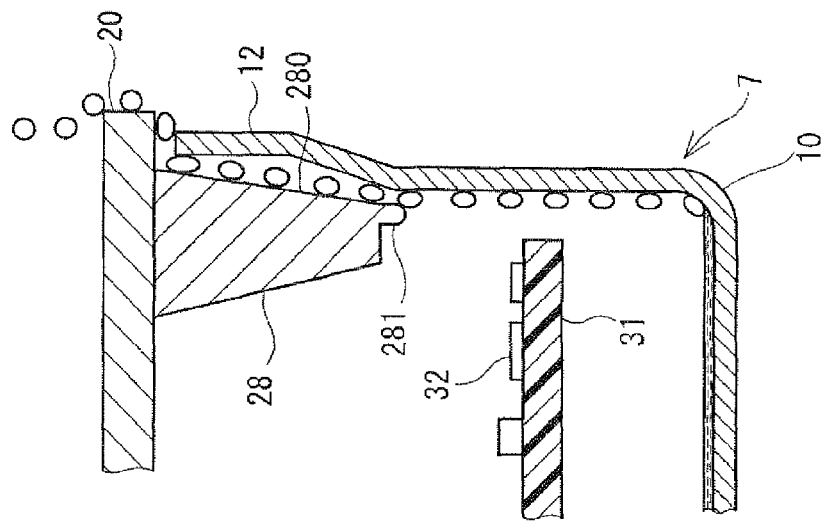

ELECTRONIC CONTROL APPARATUS

CROSS REFERENCE TO RELATED APPLICATION

This application is based on and incorporates herein by reference Japanese Patent Application No. 2009-238435 filed on Oct. 15, 2009 and No. 2010-196749 filed on Sep. 2, 2010.

FIELD OF THE INVENTION

The present invention relates to an electronic control apparatus.

BACKGROUND OF THE INVENTION

In recent years, there has been an increase in the number of vehicles equipped with an electric power steering system (hereinafter called the "EPS"). The EPS uses an electric motor to provide steering assist to a driver of a vehicle. The motor is controlled by an electronic control apparatus mounted on the vehicle.

For example, the electronic control apparatus is mounted near a steering column shaft. In this case, liquid such as interior cleaning fluid or water due condensation in the column shaft may drip on the electronic control apparatus. The liquid may enter the electronic control apparatus through a clearance between a lid and a housing of the electronic control apparatus and cause the EPS to go down. US 2007/0230137 corresponding to JP 2007-273807A discloses one method for preventing such a problem. In US 2007/0230137, the clearance is filled with a sealing material so that the inside of the electronic control apparatus can be sealed.

In another method, the electronic control apparatus may be wrapped in waterproof sheet that can prevent liquid from entering the electronic control apparatus. However, using a sealing material or using a water proof sheet can increase manufacturing cost and complicate manufacturing process.

SUMMARY OF THE INVENTION

In view of the above, it is an object of the present invention to provide an electronic control apparatus having a simple structure for preventing liquid from entering the electronic control apparatus.

According to an aspect of the present invention, an electronic control apparatus includes a housing, a lid, a fastener, and a controller. The lid covers the opening of the housing to form closed space defined by the lid and the housing. The fastener fixes the lid to the housing. The controller is located in the space. An isolation member is provided with an outer surface of one of the lid and the bottom of the housing. The outer surface has a liquid drip area where liquid is expected to drip. When the liquid drips on the liquid drip area, the isolation member causes the liquid on the liquid drip area to flow down the outer surface while avoiding the fastener.

BRIEF DESCRIPTION OF THE DRAWINGS

The above and other objectives, features and advantages of the present invention will become more apparent from the following detailed description made with check to the accompanying drawings. In the drawings:

FIG. 17A is a diagram illustrating a partial cross-sectional view of an electronic control apparatus according to a seventh embodiment of the present invention, FIG. 17B is a diagram illustrating a partial cross-sectional view of an electronic control apparatus according to a first modification of the seventh embodiment, and FIG. 17C is a diagram illustrating a partial cross-sectional view of an electronic control apparatus according to a second modification of the seventh embodiment;

DETAILED DESCRIPTION OF THE PREFERRED EMBODIMENTS

Embodiments of the present invention are described below with reference to the drawings.

First Embodiment

An electronic control apparatus 1 according to a first embodiment of the present invention is described below with reference to FIGS. 1-6. For example, the electronic control apparatus 1 can be used for a vehicle electric power steering system (EPS) that uses an electric motor to provide steering assist to a driver of a vehicle. The electronic control apparatus 1 drives and controls the motor based on a steering torque signal and a vehicle speed signal.

Figure 1:
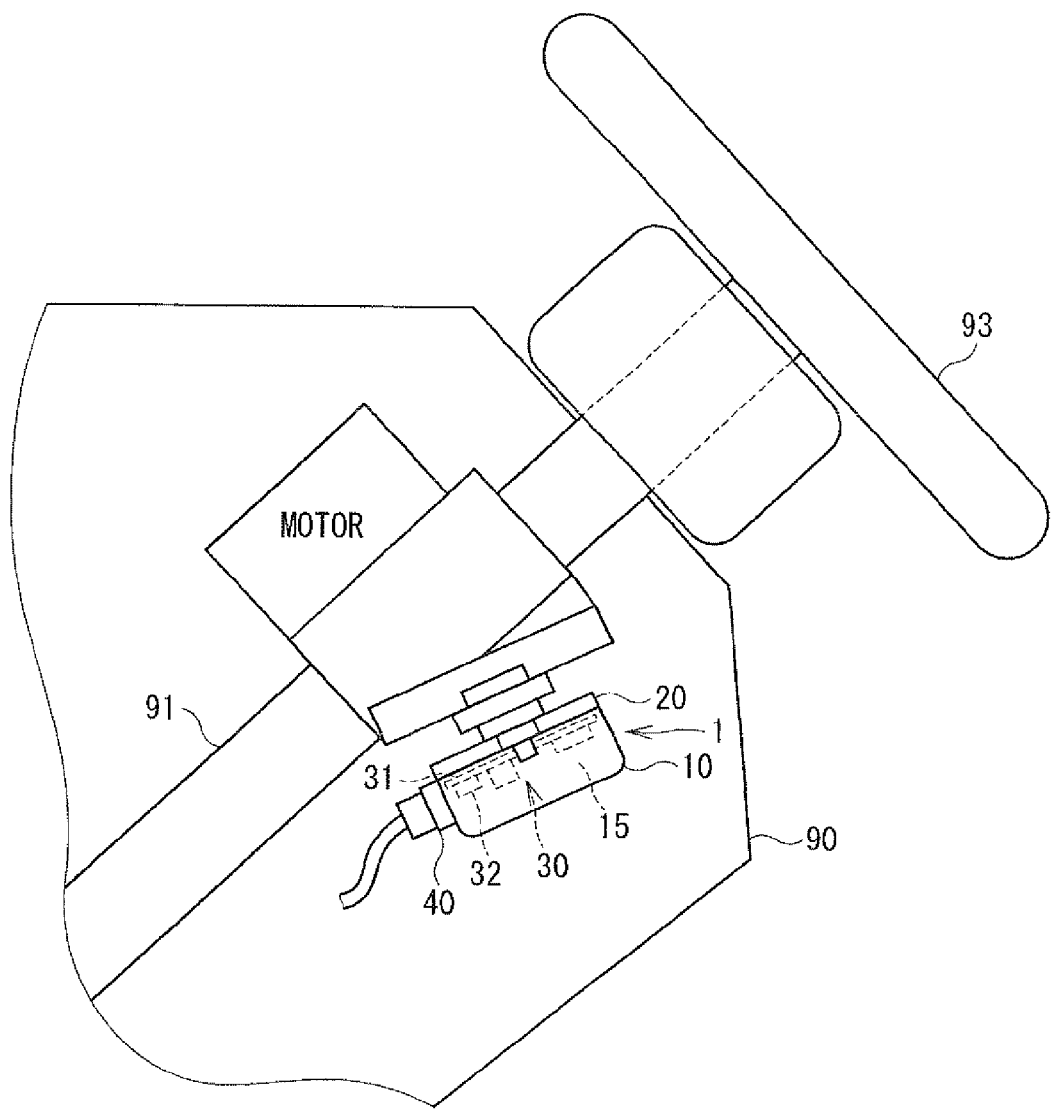
FIG. 1 is a diagram illustrating an electronic control apparatus, mounted on a vehicle, according to a first embodiment of the present invention.

For example, as shown in FIG. 1, the electronic control apparatus 1 can be installed in a dashboard 90 of the vehicle and mounted to the back side of a steering column 91 to be inclined with respect to a vertical direction. The steering column 91 is coupled to a steering wheel 93.

The electronic control apparatus 1 includes a housing 10, and a lid 20, and a controller 30. As shown in FIG. 1, the electronic control apparatus 1 is mounted to the back side of the column 91 in such a manner that the lid 20 is located above the housing 10 in the vertical direction. The electronic control apparatus 1 can further include a connector 40. A first end of the connector 40 is located in the housing 10 and electrically connected to the controller 30. A second end of the connector 40 is exposed to the outside of the housing 10 and extends downward from the housing 10.

For example, the housing 10 can be made from metal such as stainless steel plated with zinc. The housing 10 is shaped like a hollow container with an opening. The housing 10 has a side wall 12 and a bottom 13. A first end of the side wall 12 defines an opening of the housing 10. A second end of the side wall 12 is joined to the bottom 13. The first end of the side wall 12 is provided with three hooks 16-18. The lid 20 is fixed to the housing 10 by swaging the hooks 16-18 to the lid 20. Thus, the hooks 16-18 can serve as a fastener for fixing the lid 20 to the housing 10.

For example, the lid 20 can have a substantially rectangular plate shape and be made of metal such as aluminum. When the lid 20 is fixed to the housing 10, the opening of the housing 10 is covered with the lid 20 so that a closed space 15 can be formed between the housing 10 and the lid 20. The controller 30 is located in the space 15. A surface of the bottom 13 located inside the housing 10 is defined as an inner surface of the bottom 13, and a surface of the bottom 13 opposite to the inner surface of the bottom 13 is defined as an outer surface of the bottom 13. A surface of the lid 20 facing the inner surface of the bottom 13 is defined as an inner surface of the lid 20, and a surface of the lid 20 opposite to the inner surface of the lid 20 is defined as an outer surface of the lid 20.

Figure 2:
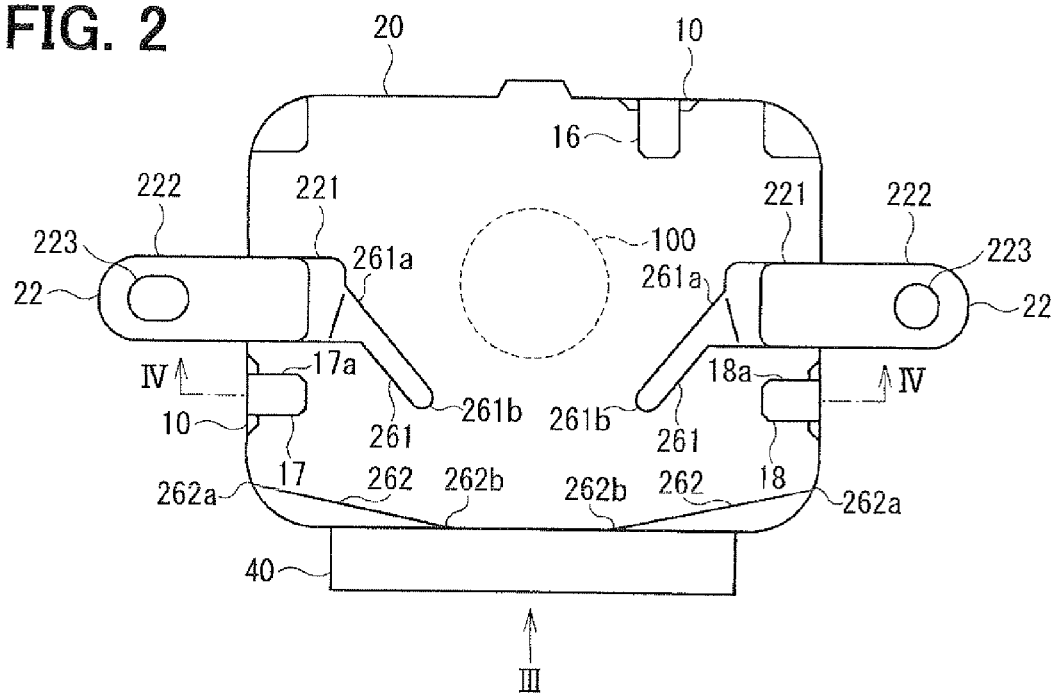
FIG. 2 is a diagram illustrating a top view of the electronic control apparatus according to the first embodiment.

As shown in FIG. 2, the outer surface of the lid 20 has a liquid drip area 100. The liquid drip area 100 is an area where liquid such as water due to condensation is expected to drip when the electronic control apparatus 1 is mounted to the vehicle. For example, the liquid drip area 100 can be an area where water due to condensation occurring in the steering column 91 is expected to drip when the electronic control apparatus 1 is mounted to the back side of the steering column 91. A direction in which liquid dripped on the liquid drip area 100 flows down the outer surface of the lid 20 is defined as a flow direction. As shown in FIG. 2, the hook 16 is swaged to the lid 20 at a position above the liquid drip area 100 in the flow direction, and the hooks 17 and 18 are swaged to the lid 20 at positions below the liquid drip area 100 in the flow direction.

As shown in FIG. 2, the outer surface of the lid 20 is provided with a pair of flow path portions 261 that are located symmetrically with respect to the center of the lid 20. Further, the outer surface of the lid 20 is provided with a pair of guiding portions 262 that are located symmetrically with respect to the center of the lid 20. Furthermore, the outer surface of the lid 20 is provided with a pair of fixing members 22 that are located symmetrically with respect to the center of the lid 20.

One flow path portion 261 is located between the liquid drip area 100 and the hook 17, and the other flow path portion 261 is located between the liquid drip area 100 and the hook 18. The flow path portion 261 extends in a direction perpendicular to the outer surface of the lid 20 and can be in contact with the outer surface of the lid 20. The flow path portion 261 is inclined with respect to each of four sides of the rectangular lid 20. One end 261a of the flow path portion 261 is located above the other end 261b of the flow path portion 261 in the flow direction. Further, the other end 261b of the flow path portion 261 is located below each of an upper edge 17a, 18a of the hooks 17, 18 in the flow direction. For example, the hooks 17 and 18 can be swaged to the lid 20 at positions below the respective flow path portions 261 in the flow direction.

The guiding portion 262 is located below the flow path portion 261 in the flow direction. For example, the guiding portion 262 can be located at each lower corner of the outer surface of the lid 20. One end 262a of the guiding portion 262 is located above the other end 262b of the guiding portion 262 in the flow direction so that the guiding portion 262 can be sloped down toward the center of the lower side of the lid 20 from the one end 262a to the other end 262b. The other end 262b of the guiding portion 262 extends beyond the other end 261b of the flow path portion 261 in a direction parallel to the lower side of the lid 20. In other wards, the other end 262b of the guiding portion 262 is located closer to the center line of the lower side of the lid 20 than the other end 261b of the flow path portion 261.

Figure 3:
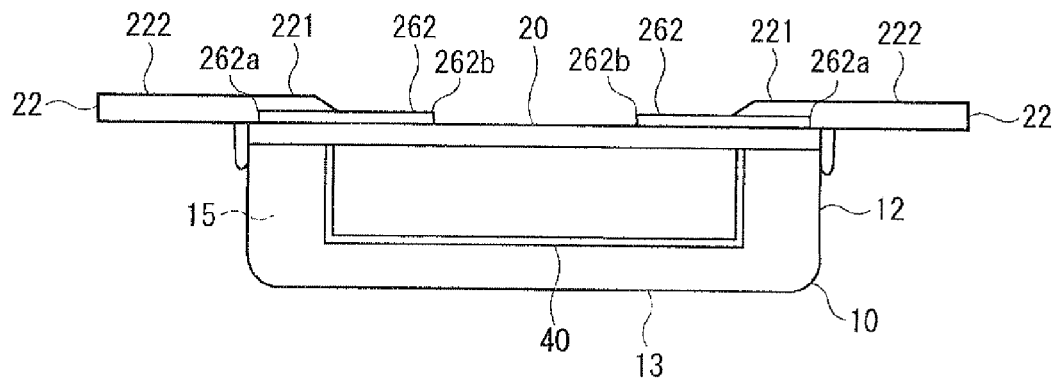
FIG. 3 is a diagram illustrating a view from a direction indicated by an allow III in FIG. 2.

The fixing member 22 includes a base 221 and a mounting portion 222. The base 221 is joined to the lid 20. The mounting portion 222 is fixed to an object to which the electronic control apparatus 1 is mounted. The base 221 and the flow path portion 261 can be integrally formed as a single piece in such a manner that the flow path portion 261 extends continuously from the base 221. One end of the mounting portion 222 has a bolt hole 223, and the other end of the mounting portion 222 is integrally joined to the base 221. As shown in FIGS. 2 and 3, the mounting portion 222 projects outward from the lid 20. The fixing members 22 allow the housing 10 and the lid 20 to be mounted to the object. In other words, the electronic control apparatus 1 is mounted to the object by the fixing members 22. According to the first embodiment, the electronic control apparatus 1 is mounted to the steering column 91 by the fixing members 22.

The fixing members 22 are located above the hooks 17, 18 in the flow direction. As can be seen from FIG. 4, the height of the fixing member 22 from the outer surface of the lid 20 is greater than the height of the flow path portion 261 from the outer surface of the lid 20. The flow path portions 261 and the fixing members 22 cover the hooks 17, 18 from the liquid drip area 100. For example, one end of the base 221 of each of the fixing members 22 is located closer to the liquid drip area 100 than the hooks 17, 18 so that the fixing members 22 can cover the hooks 17, 18 from the liquid drip area 100.

Figure 4:
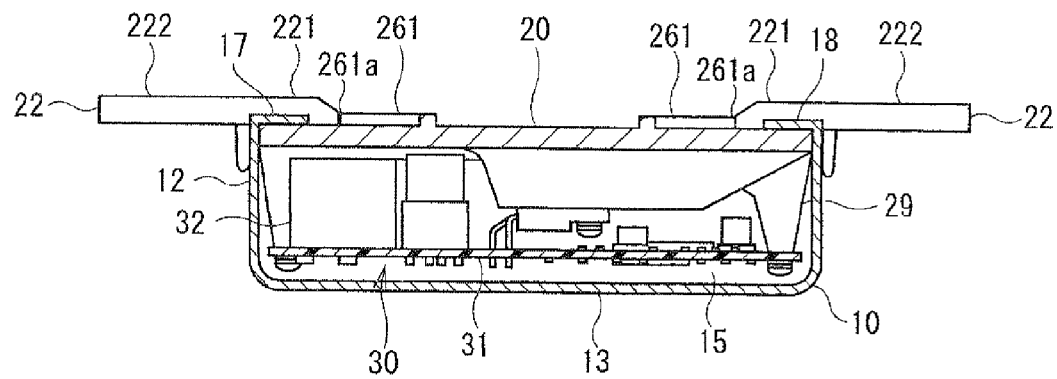
FIG. 4 is a diagram illustrating a cross-sectional view taken along line IV-IV in FIG. 2.
Figure 5:
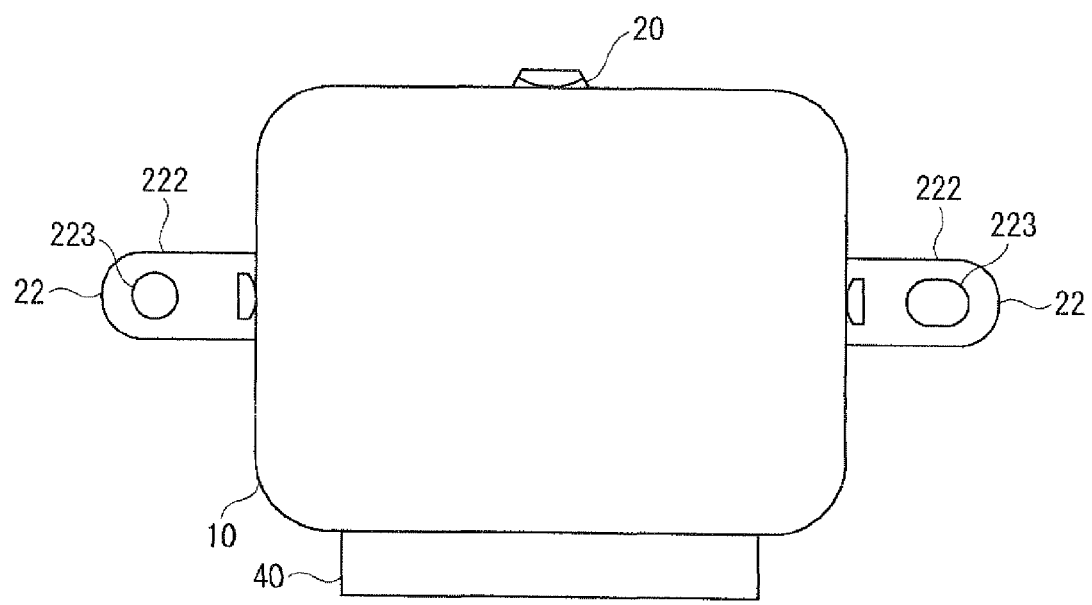
FIG. 5 is a diagram illustrating a bottom view of the electronic control apparatus according to the first embodiment.

As shown in FIG. 4, the controller 30 is located in the closed space 15. The controller 30 has a substrate 31 and electronic devices 32 mounted on the substrate 31. Examples of the electronic devices 32 can include a MOS transistor, an aluminum electrolytic capacitor, a coil, a relay, and a shunt resistor. For example, the substrate 31 can have a screw hole at a position where no electronic device is mounted. In this case, the substrate 31 can be fixed to the lid 20 by inserting a screw through the screw hole into a screw receiver 29 of the lid 20.

Advantages of the first embodiment are described below. According to the first embodiment, the flow path portions 261 are located between the liquid drip area 100 and the hooks 17, 18. In such an approach, the flow path portions 261 can prevent the liquid dripped on the liquid drip area 100 from entering the electronic control apparatus 1 through clearances between the lid 20 and hooks 17, 18.

The one end 261a of the flow path portion 261 is located above the other end 261b of the flow path portion 261 in the flow direction so that the hooks 17, 18 can be covered from above by the flow path portions 261. Thus, the flow path portions 261 can effectively prevent the liquid from entering the electronic control apparatus 1 through the clearances between the lid 20 and hooks 17, 18.

The fixing member 22 and the flow path portion 261 are integrally formed so that the flow path portion 261 extends continuously from the fixing member 22. In such an approach, the whole area of the hooks 17, 18 can be covered from above so that the liquid can be surely prevented from entering the electronic control apparatus 1 through the clearances between the lid 20 and hooks 17, 18.

The height (i.e., thickness) of the fixing member 22 from the outer surface of the lid 20 is greater than the height (i.e., thickness) of the flow path portion 261 from the outer surface of the lid 20. In such an approach, the fixing member 22 can have enough strength, and also the fixing member 22 (i.e., the base 221) can surely prevent the liquid from reaching the hooks 17, 18.

The guiding portion 262 is located at each lower corner of the outer surface of the lid 20. In such an approach, the guiding portion 262 can prevent the liquid from entering the electronic control apparatus 1 through a clearance between the housing 10 and each end of the connector 40.

The one end 262a of the guiding portion 262 is located above the other end 262b of the guiding portion 262 in the flow direction. In such an approach, even when the liquid collects at the guiding portion 262, the liquid does not flow toward each end of the lid 20.

The other end 262b of the guiding portion 262 is located closer to the center line of the lower side of the lid 20 than the other end 261b of the flow path portion 261. In such an approach, the liquid is guided by the guiding portion 262 toward the center of the connector 40 and thus does not flow toward each end of the connector 40.

Figure 6:
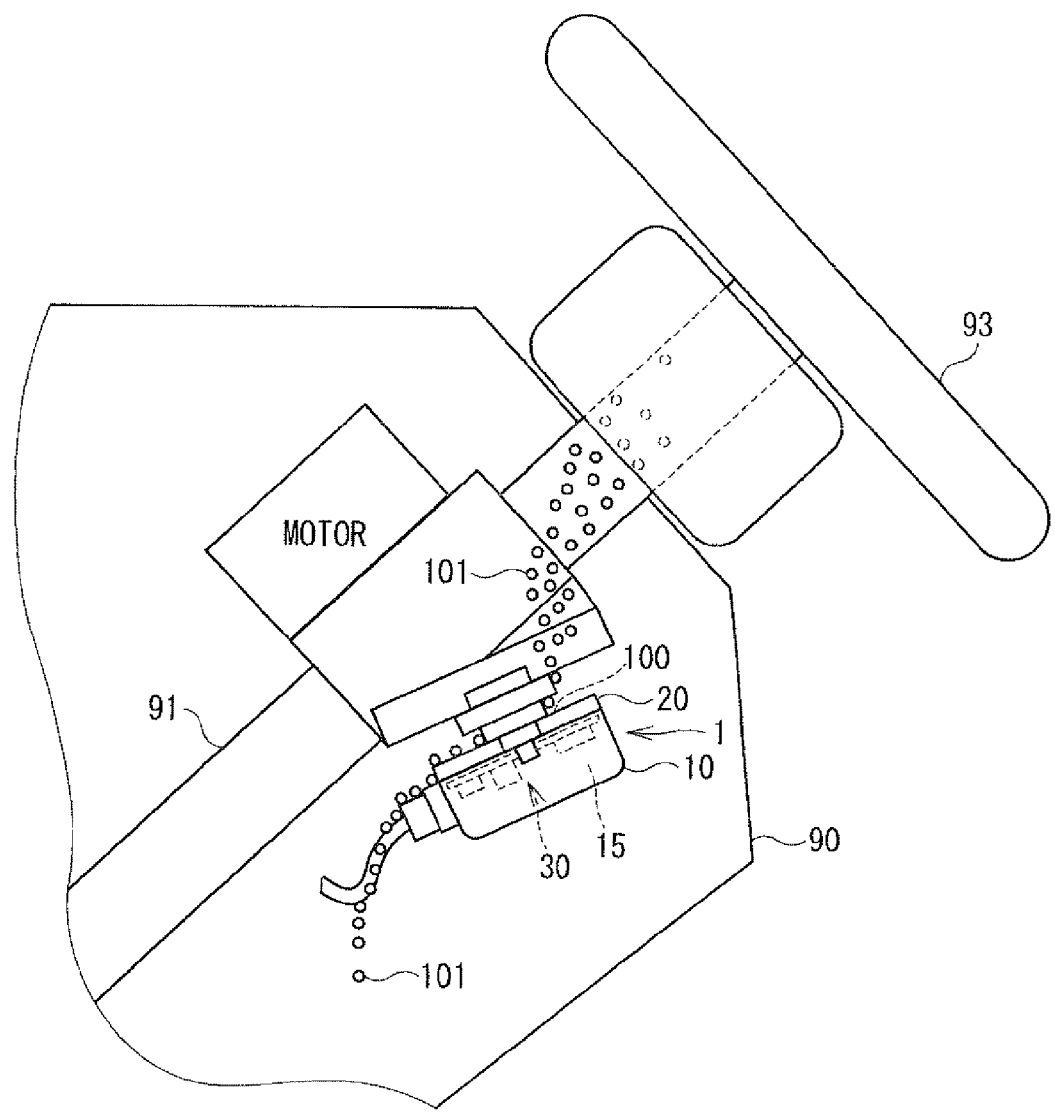
FIG. 6 is a diagram illustrating a flow of water dripping on the electronic control apparatus according to the first embodiment.

In summary, as shown in FIG. 6, when a liquid 101 entering the dashboard 90 through a clearance between the dashboard 90 and the steering column 91 drips on the liquid drip area 100 on the outer surface of the lid 20, the flow path portion 261 and the guiding portion 262 guide the liquid 101 so that the liquid 101 can fall from the electronic control apparatus 1 along the connector 40.

Second Embodiment

An electronic control apparatus 2 according to a second embodiment of the present invention is described below with reference to FIGS. 7-9. The second embodiment differs from the second embodiment in the following points.

Figure 7:
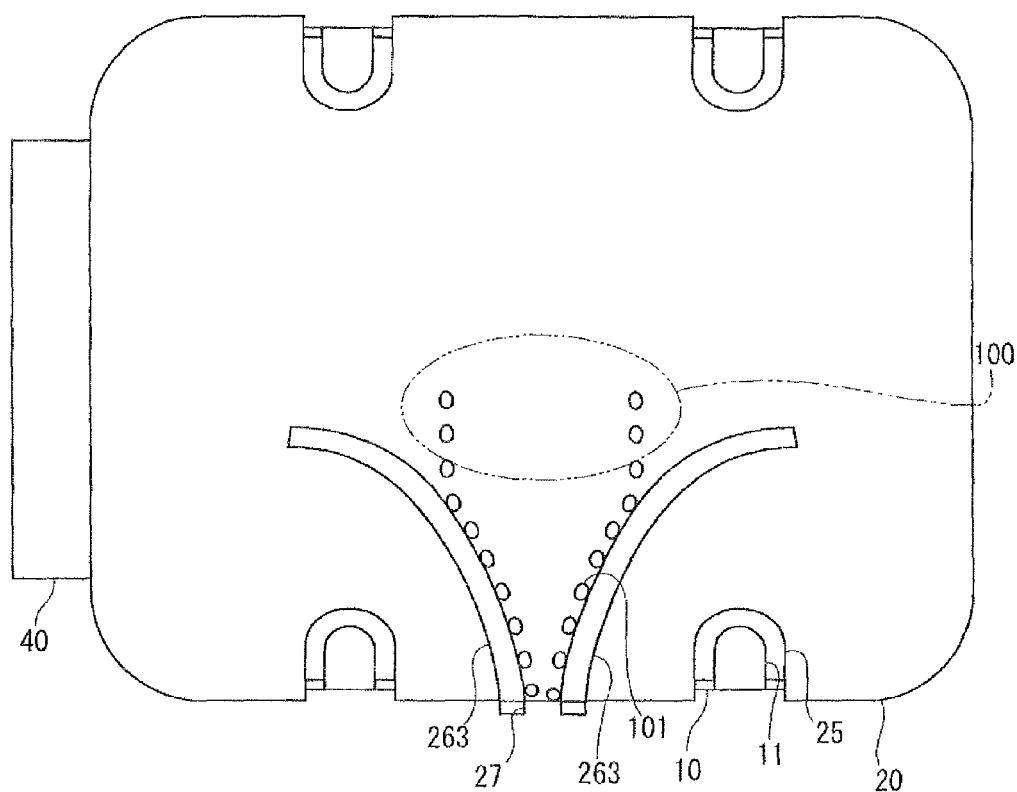
FIG. 7 is a diagram illustrating a top view of an electronic control apparatus according to a second embodiment of the present invention.

As shown in FIG. 7, according to the second embodiment, the housing 10 has four hooks 11. Each two hooks 11 are located symmetrically. The inner surface of the lid 20 has four hook receivers 25 corresponding to the hooks 11. The lid 20 is fixed to the housing 10 by fitting each hook 11 of the housing 10 to a corresponding hook receiver 25 of the lid 20.

The outer surface of the lid 20 has a pair of flow path portions 263. The flow path portion 263 extends from the outer surface of the lid 20 in a direction perpendicular to the outer surface of the lid 20. The flow path portion 263 is located between the liquid drip area 100 and the hook receiver 25 that is located below the liquid drip area 100 in the flow direction. Thus, the flow path portion 263 covers from above the hook receiver 25 that is located below the liquid drip area 100 in the flow direction.

Figure 8:
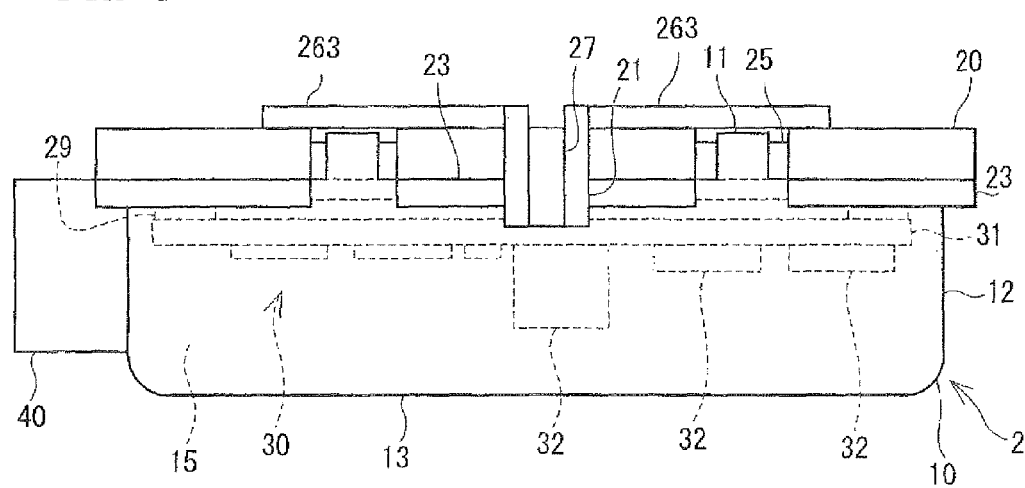
FIG. 8 is a diagram illustrating a side view of the electronic control apparatus according to the second embodiment.

As shown in FIG. 8, the inner surface of the lid 20 has a housing fixing hook 21. The housing fixing hook 21 extends from the lid 20 along an outer wall of the housing 10 to cross a clearance between the lid 20 and the housing 10. The housing 10 is fixed to the lid 20 by the housing fixing hook 21 in such a manner that the housing 10 is not displaced relative to the lid 20 in a direction toward the bottom 13.

A guiding slot 27 is located on the housing fixing hook 21 between the flow path portions 263. The liquid 101 guided by the flow path portions 263 to the lower side of the lid 20 falls from the electronic control apparatus 2 along the guiding slot 27.

Figure 9A:
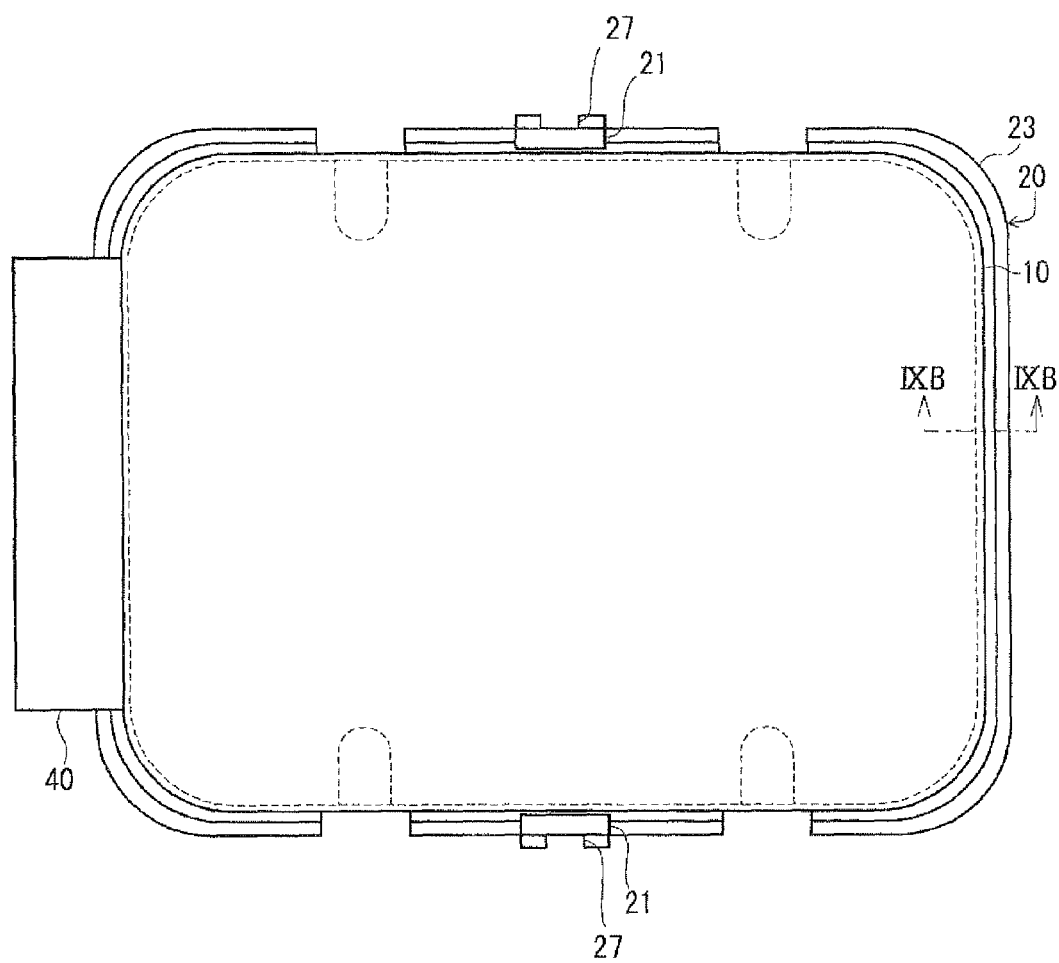
FIG. 9A is a diagram illustrating a bottom view of the electronic control apparatus according to the second embodiment.
Figure 9B:
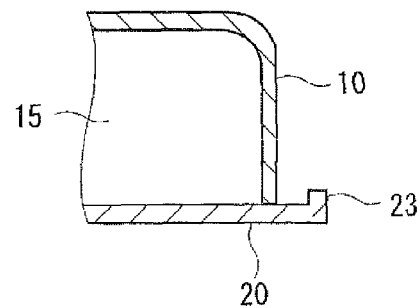
FIG. 9B is a diagram illustrating a cross-sectional view taken along line IXB-IXB in FIG. 9A.

FIGS. 9A and 9B illustrate a view from the outer surface of the bottom 13 of the housing 10. As shown in FIGS. 8, 9A and 9B, the inner surface of the lid 20 is provided with an extension wall 23. The extension wall 23 is located along an outer edge of the inner surface of the lid 20 and extends toward the housing 10 parallel to the outer wall of the housing 10. As shown in details in FIG. 9B, the extension wall 23 has a length enough to cover a clearance between the lid 20 and the housing 10. For example, the extension wall 23 can have a length of from about 3 millimeters to about 5 millimeters.

Advantages of the second embodiment are described below. According to the second embodiment, the outer surface of the lid 20 has the flow path portion 263, and the flow path portion 263 is located between the liquid drip area 100 and the hook receiver 25 that is located below the liquid drip area 100 in the flow direction. In such an approach, the flow path portion 263 guides the liquid 101 dripped on the liquid drip area 100 to the lower edge of the lid 20 while preventing the liquid 101 from reaching a clearance between the hook 11 and the hook receiver 25. Thus, the flow path portion 263 prevents the liquid 101 from entering the electronic control apparatus 2 through the clearance between the hook 11 and the hook receiver 25.

The guiding slot 27 is located on the housing fixing hook 21 between the flow path portions 263. In such an approach, the liquid 101 guided by the flow path portions 263 to the lower side of the lid 20 falls from the electronic control apparatus 2 along the guiding slot 27.

The housing fixing hook 21 extends from the lid 20 along the outer wall of the housing 10 to cross the clearance between the lid 20 and the housing 10. Thus, the housing fixing hook 21 prevents the liquid 101 flowing along the guiding slot 27 from entering the electronic control apparatus 2 through the clearance between the lid 20 and the housing 10.

The extension wall 23 is located along the outer edge of the inner surface of the lid 20 and extends toward the housing 10 to cover the clearance between the lid 20 and the housing 10. Therefore, the extension wall 23 prevents the liquid 101 from entering the electronic control apparatus 2 by surface tension through the clearance between the lid 20 and the housing 10.

In this way, the electronic control apparatus 2 according to the second embodiment has a simple structure for achieving high waterproof performance.

Third Embodiment

Figure 10:
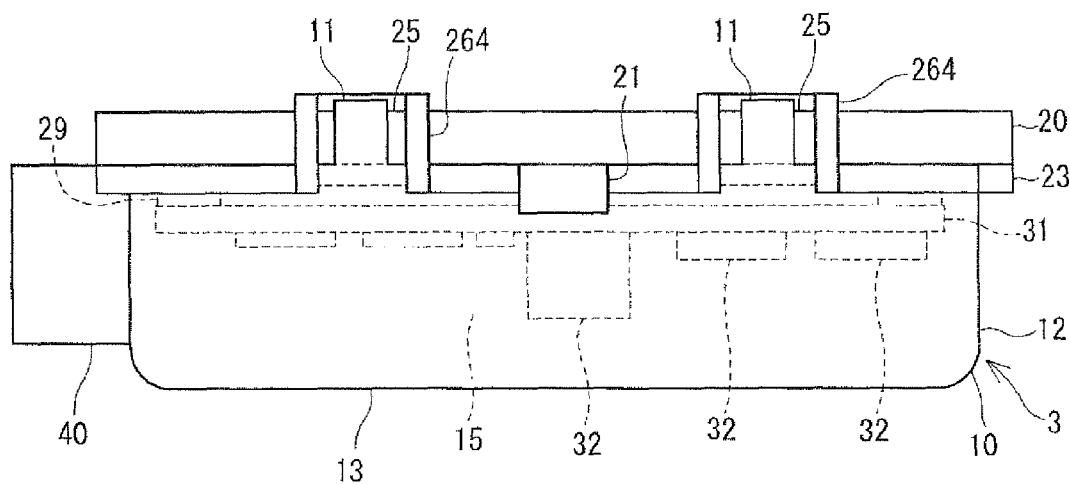
FIG. 10 is a diagram illustrating a side view of an electronic control apparatus according to a third embodiment of the present invention.
Figure 11:
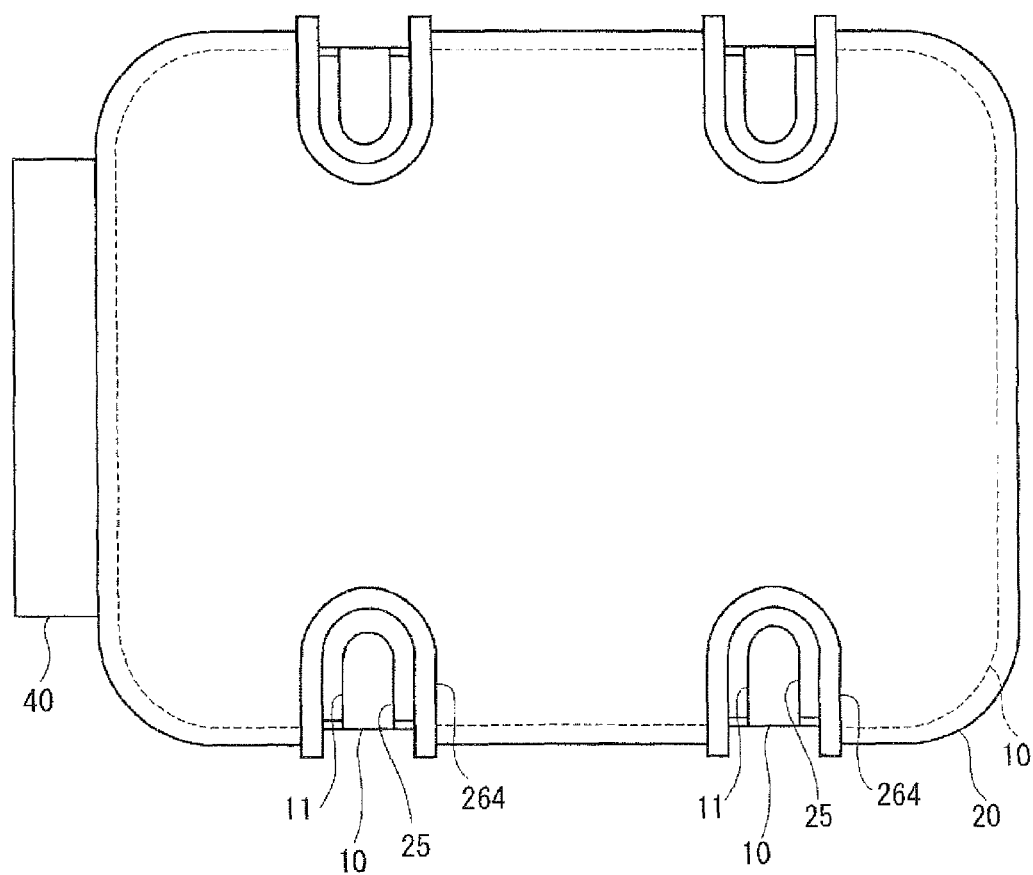
FIG. 11 is a diagram illustrating a top view of the electronic control apparatus according to the third embodiment.
Figure 12A:
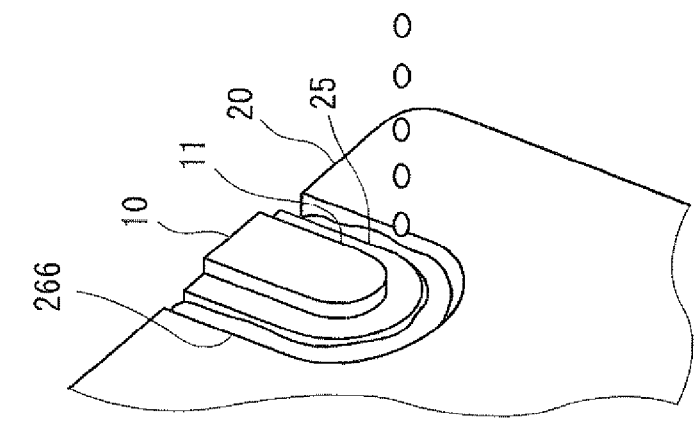
FIG. 12A is a diagram illustrating a partial enlarged view of the electronic control apparatus to the third embodiment.

An electronic control apparatus 3 according to a third embodiment of the present invention is described below with reference to FIGS. 10, 11, and 12A. The third embodiment differs from the preceding embodiments in the following points. As shown in FIGS. 10 and 11, the outer surface of the lid 20 has an isolation wall 264 (as an outline portion) extending along an outline of the hook receiver 25. The height of the isolation wall 264 from the outer surface of the lid 20 is high enough to prevent the liquid 101 from reaching the hook 11. As shown in detain in FIG. 12A, it is preferable that the hook 11 exposed to the outer surface of the lid 20 should be completely surrounded by the isolation wall 264. Further, as shown in FIG. 10, it is preferable that the isolation wall 264 should be elongated from the outer surface of the lid 20 to the inner surface of the lid 20 and be joined to an end of the extension wall 23.

Figure 12B:
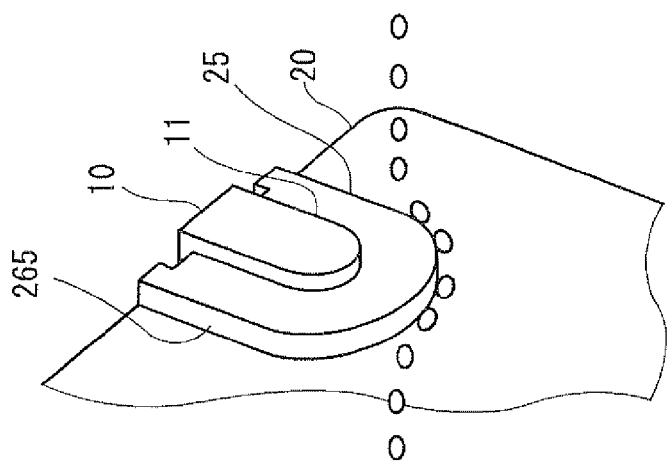
FIG. 12B is a diagram illustrating a partial enlarged view of an electronic control apparatus to according to a first modification of the third embodiment.

FIG. 12B shows a first modification of the third embodiment. As shown in FIG. 12B, the outer surface of the lid 20 can have an isolation seat 265 instead of the isolation wall 264. The isolation seat 265 and the hook receiver 25 are integrally formed as a single piece. The height of the isolation seat 265 from the outer surface of the lid 20 is high enough to prevent the liquid 101 from reaching the hook 11.

Figure 12C:
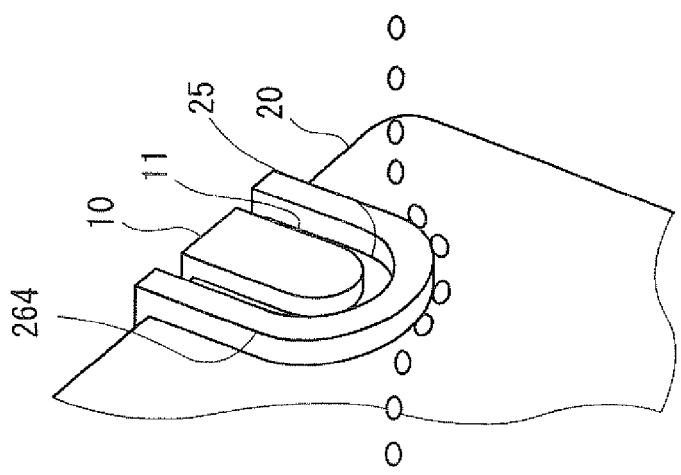
FIG. 12C is a diagram illustrating a partial enlarged view of an electronic control apparatus to according to a second modification of the third embodiment.

FIG. 12C shows a second modification of the third embodiment. As shown in FIG. 12C, the outer surface of the lid 20 can have an isolation groove 266 instead of the isolation wall 264. The depth of the isolation groove 266 from the outer surface of the lid 20 is deep enough to prevent the liquid 101 from reaching the hook 11.

As described above, according to the third embodiment, the outer surface of the lid 20 is provide with an isolation member, such as the isolation wall 264, the isolation seat 265, or the isolation groove 266, for preventing the liquid 101 from entering the electronic control apparatus 3 through the clearance between the hook 11 and the hook receiver 25. In this way, the electronic control apparatus 3 according to the third embodiment has a simple structure for achieving high waterproof performance.

Fourth Embodiment

Figure 13:
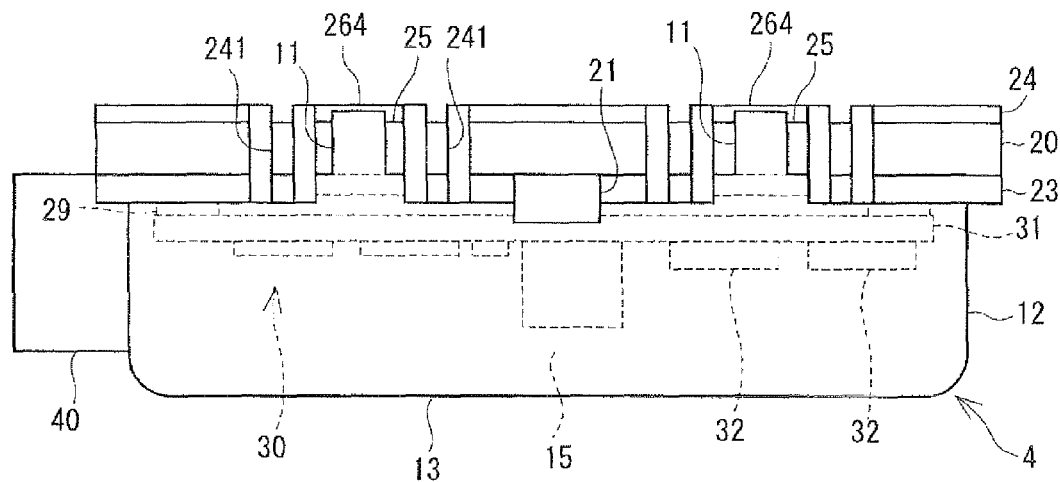
FIG. 13 is a diagram illustrating a side view of an electronic control apparatus according to a fourth embodiment of the present invention.
Figure 14:
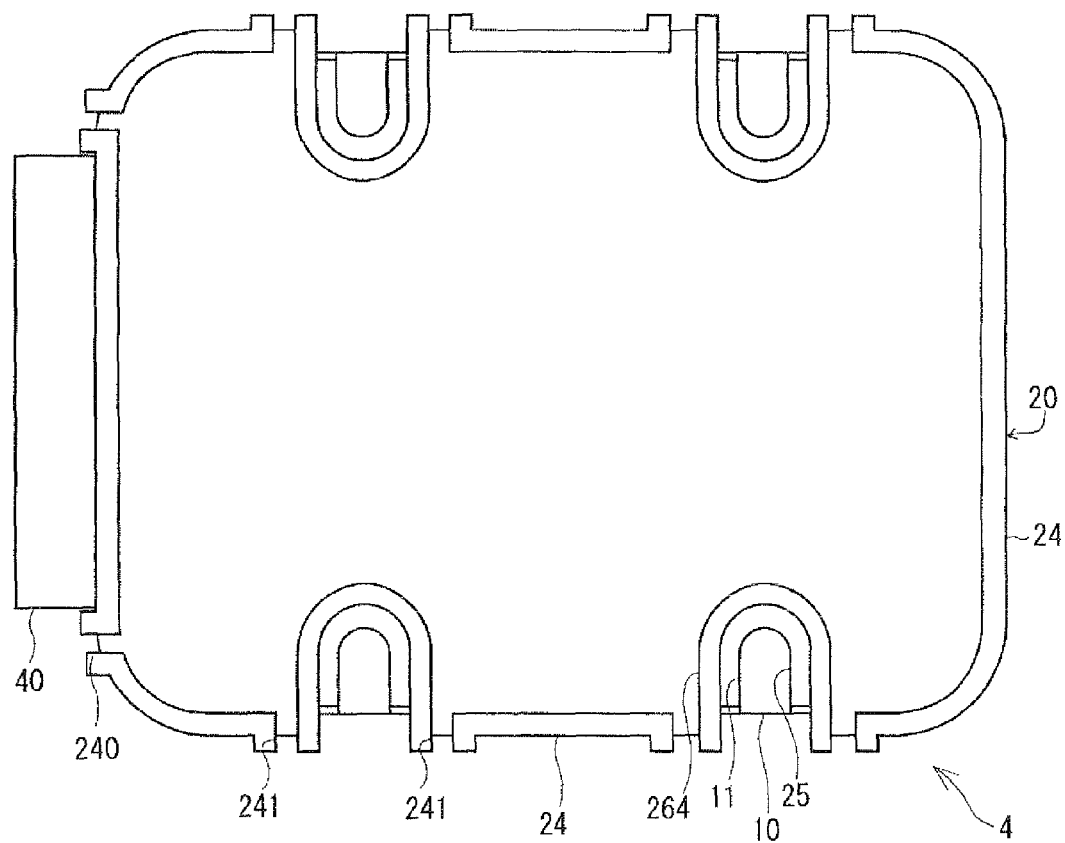
FIG. 14 is a diagram illustrating a top view of an electronic control apparatus according to the fourth embodiment.

An electronic control apparatus 4 according to a fourth embodiment of the present invention is described below with reference to FIGS. 13 and 14. The fourth embodiment differs from the preceding embodiments in the following points. As shown in FIGS. 13 and 14, the electronic control apparatus 4 has a surrounding wall 24 that extends along an outer edge (i.e., periphery) of the outer surface of the lid 20 and projects in a direction perpendicular to the outer surface of the lid 20. In other words, the surrounding wall 24 stands on the outer surface of the lid 20 to surround the outer edge of the outer surface of the lid 20. The surrounding wall 24 is separated from the isolation wall 264 by a predetermined distance to form a discharging slit 241 therebetween. Further, the surrounding wall 24 is separated from another surrounding wall 24 by a predetermined distance to form a discharging slit 240 therebetween. As shown in FIG. 14, the discharging slit 240 is located at each end of the connector 40. It is preferable that the discharging slits 240, 241 should be located in such a manner that the liquid 101 discharged through the discharging slits 240, 241 does not affect other members located near the electronic control apparatus 4.

As described above, according to the fourth embodiment, the surrounding wall 24 stands on the outer surface of the lid 20 to surround the outer edge of the outer surface of the lid 20. In such an approach, the surrounding wall 24 prevents the liquid 101 dripped on the liquid drip area 100 from entering the electronic control apparatus 4 through the clearance between the lid 20 and the housing 10, in particular, through the clearance between the connector 40 and the lid 20.

The surrounding wall 24 can have multiple discharging slits 241 located at different positions. In such an approach, the liquid 101 dripped on the liquid drip area 100 can be discharged by inclining the electronic control apparatus 4 in a direction in which at least one discharging slit 241 is located. Thus, the electronic control apparatus 4 can be mounted in various manners.

The discharging slit 240 located at each end of the connector 40 guides and discharges the liquid 101 to prevent the liquid 101 from entering the electronic control apparatus 4 through the clearance between the connector 40 and the housing 10. In this way, the electronic control apparatus 4 according to the fourth embodiment has a simple structure for achieving high waterproof performance.

Figure 15:
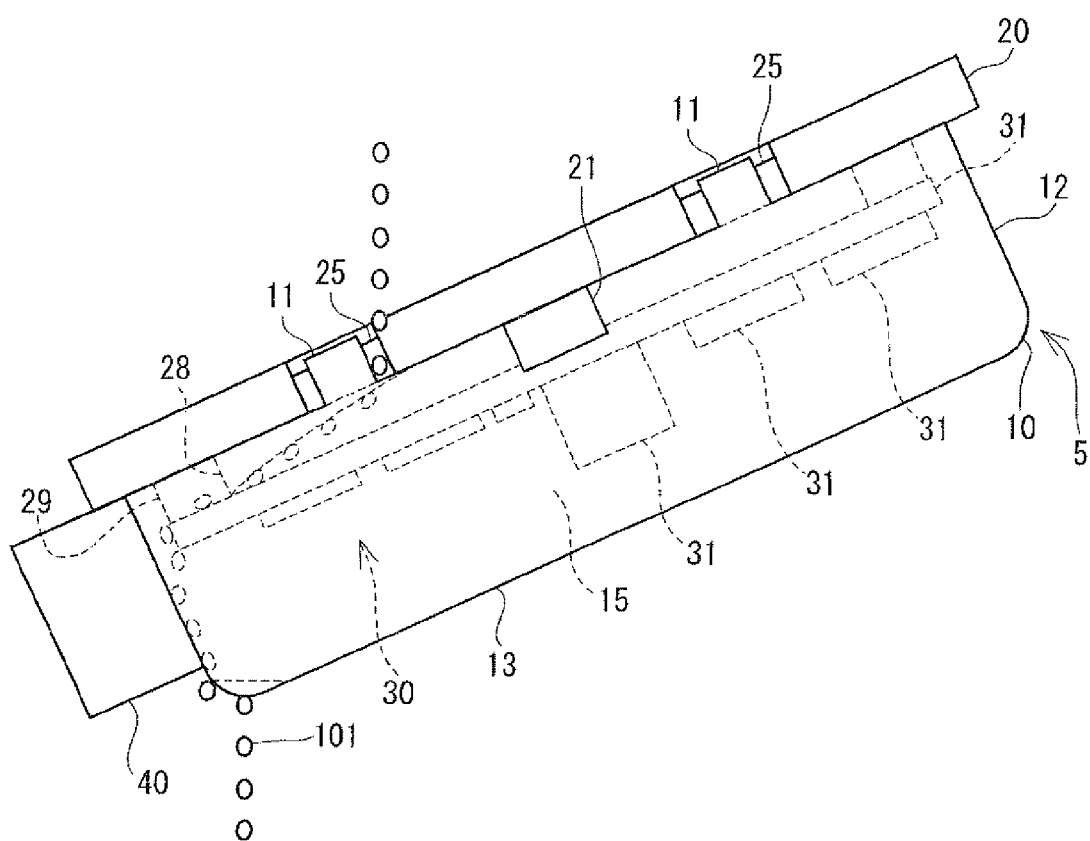
FIG. 15 is a diagram illustrating a side view of an electronic control apparatus according to a fifth embodiment of the present invention.

An electronic control apparatus 5 according to a fifth embodiment of the present invention is described below with reference to FIG. 15. The fifth embodiment differs from the preceding embodiments in the following points. As shown in FIG. 15, the electronic control apparatus 5 has a fitting portion 28 formed on the inner surface of the lid 20. The fitting portion 28 helps the housing 10 and lid 20 to be correctly positioned with respect to each other. Further, the fitting portion 28 has a taper shape for guiding the liquid 101 to a predetermined region in the space 15. For example, the taper shape can mean that the thickness of the fitting portion 28 from the inner surface of the lid 20 decreases from the screw receiver 29-side to the hook receiver 25-side. In other words, the taper shape can mean that the height of the fitting portion 28 from the inner surface of the lid 20 decreases from the screw receiver 29-side to the hook receiver 25-side.

When the fitting portion 28 on the inner surface of the lid 20 has such a taper shape, the liquid 101 entering the electronic control apparatus 5 is guided by the fitting portion 28 to a predetermined region where no electronic device is located. Specifically, as shown in FIG. 15, the liquid 101 entering the electronic control apparatus through the clearance between the hook 11 and the hook receiver 25 flows along the fitting portion 28 to the screw receiver 29 and falls from a predetermined region of the substrate 31 where no electronic device 32 is mounted. Therefore, even if the liquid 101 enters the electronic control apparatus 5 through the clearance between the hook 11 and the hook receiver 25, it is less likely that the electronic device 32 is exposed to the liquid 101. In this way, the electronic control apparatus 5 according to the fifth embodiment has a simple structure for achieving high waterproof performance.

Sixth Embodiment

Figure 16A:
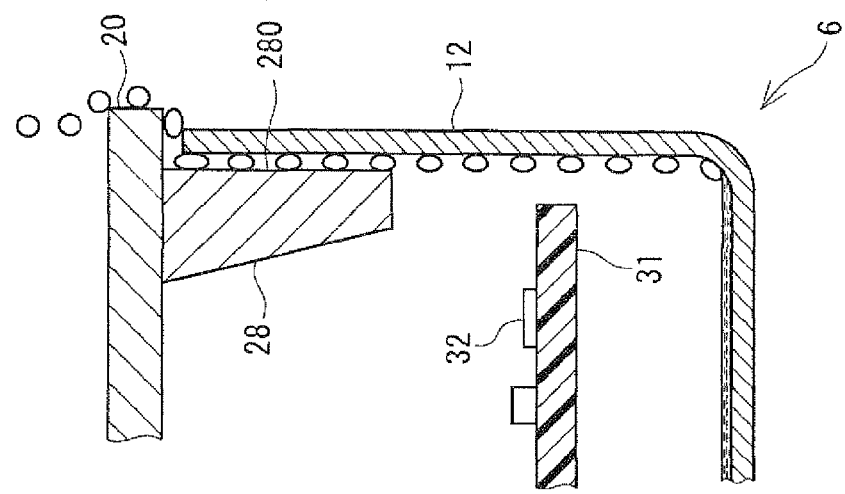
FIG. 16A is a diagram illustrating a partial cross-sectional view of an electronic control apparatus according to a sixth embodiment of the present invention.

An electronic control apparatus 6 according to a sixth embodiment of the present invention is described below with reference to FIG. 16A. The sixth embodiment differs from the preceding embodiments in the following points. As shown in FIG. 16A, according to the sixth embodiment, a outer side wall 280 of the fitting portion 28 is located closer to the inner side wall of the housing 10 than an outer edge of the substrate 31. In other wards, a first gap between the outer side wall 280 of the fitting portion 28 and the inner side wall of the housing 10 is less than a second gap between the outer edge of the substrate 31 and the inner side wall of the housing 10. It is preferable that the first gap between the outer side wall 280 of the fitting portion 28 and the inner side wall of the housing 10 should have a width that allows the liquid 101 in the first gap to flow down along the inner side wall of the housing 10 by surface tension. It is preferable that the outer side wall 280 of the fitting portion 28 should be parallel to the inner side wall of the housing 10. Alternatively, the inner side wall of the housing 10 can be parallel to the outer side wall 280 of the fitting portion 28.

Figure 16B:
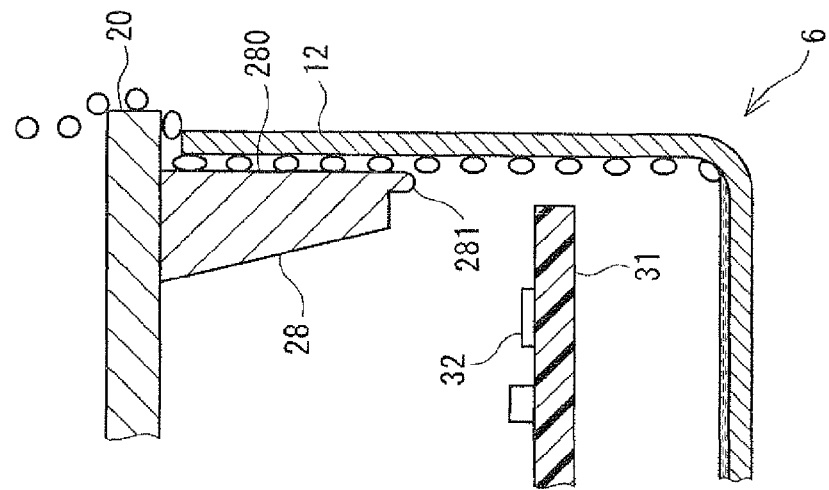
FIG. 16B is a diagram illustrating a partial cross-sectional view of an electronic control apparatus according to a first modification of the sixth embodiment.

FIG. 16B shows a first modification of the sixth embodiment. As shown in FIG. 16B, the fitting portion 28 can have a protrusion 281 at its bottom wall. It is preferable that the protrusion 281 should be located closer to the inner side wall of the housing 10 than the outer edge of the substrate 31. In FIG. 16B, the protrusion 281 extends continuously from the outer side wall 280 to form a flat surface therebetween. Alternatively, the protrusion 281 can extend discontinuously from the outer side wall 280 not to form a flat surface therebetween.

Figure 16C:
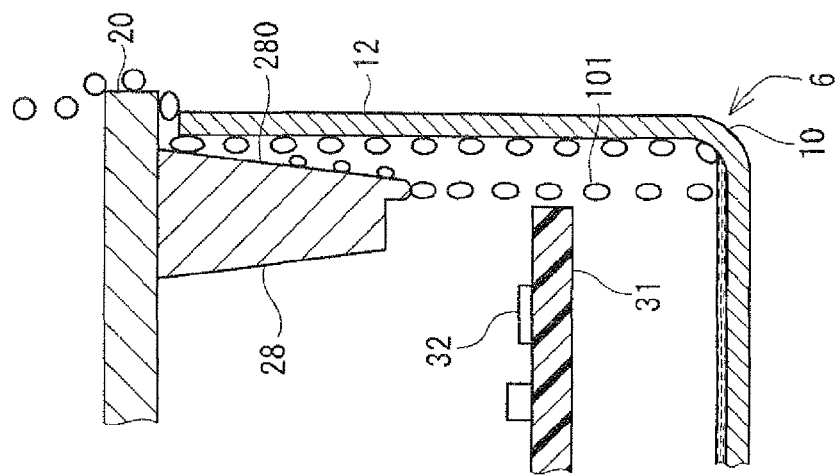
FIG. 16C is a diagram illustrating a partial cross-sectional view of an electronic control apparatus according to a second modification of the sixth embodiment.

FIG. 16C shows a second modification of the sixth embodiment. As shown in FIG. 16C, the outer side wall 280 of the fitting portion 28 can be not parallel to the inner side wall of the housing 10.

As describe above, according to the sixth embodiment, the outer side wall 280 of the fitting portion 28 is located closer to the inner side wall of the housing 10 than the outer edge of the substrate 31. Thus, the fitting portion 28 guides the liquid 101 entering the electronic control apparatus 6 through the clearance between the lid 20 and the housing 10 to allow the liquid to flow down along the inner side wall of the housing 10. The fitting portion 28 can have the protrusion 281 that effectively prevents the liquid 101 from reaching the substrate 31. In this way, the electronic control apparatus 6 according to the sixth embodiment has a simple structure for achieving high waterproof performance.

Seventh Embodiment

An electronic control apparatus 7 according to a seventh embodiment of the present invention is described below with reference to FIG. 17A. The seventh embodiment differs from the preceding embodiments in the following points. As shown in FIG. 17A, according to the seventh embodiment, the inner side wall of the housing 10 facing the outer side wall 280 of the fitting portion 28 has at least one recess 121 and at least one projection 122. A gap between the outer side wall 280 of the fitting portion 28 and the inner side wall of the housing 10 has a first width at the recess 121 and a second width at the projection 122. It is preferable that the second width should allow the liquid 101 in the gap to flow down along the inner side wall of the housing 10.

FIG. 17B shows a first modification of the sixth embodiment. As shown in FIG. 17B, the fitting portion 28 can have no protrusion 281.

FIG. 17C shows a second modification of the sixth embodiment. As shown in FIG. 17C, the inner side wall of the housing 10 can have multiple recesses 121 and multiple projections 122. Since the recess 121 and the projection 122 can increase surface tension between the liquid 101 and the inner side wall of the housing 10, it is likely that the liquid 101 flows down along the inner side wall of the housing 10. In FIG. 17C, the recess 121 and the projection 122 have a rectangular shape in cross section. It is noted that the recess 121 and the projection 122 can have a shape in cross section other than a rectangular shape.

As described above, according to the seventh embodiment, the inner side wall of the housing 10 facing the outer side wall 280 of the fitting portion 28 has at least one recess 121 and at least one projection 122. In such an approach, the liquid 101 entering the electronic control apparatus 6 through the clearance between the lid 20 and the housing 10 can be guided to flow down along the inner side wall of the housing 10. The gap between the outer side wall 280 of the fitting portion 28 and the projection 122 of the inner side wall of the housing 10 can have the second width that allows the liquid 101 in the gap to flow down along the inner side wall of the housing 10. The inner side wall of the housing 10 can have multiple recesses 121 and multiple projections 122 to increase the surface area of the inner side wall of the housing 10. The increase in the surface area results in an increase in the surface tension between the liquid 101 and the inner side wall of the housing 10. Therefore, it is likely that the liquid 101 flows down along the inner side wall of the housing 10, and consequently it is less likely that the liquid 101 reaches the substrate 31. In this way, the electronic control apparatus 7 according to the seventh embodiment has a simple structure for achieving high waterproof performance.

Eighth Embodiment

An electronic control apparatus 8 according to an eighth embodiment of the present invention is described below with reference to FIGS. 18 and 19. The electronic control apparatus 8 of the eighth embodiment is similar to but differs from the electronic control apparatus 6 of the sixth embodiment in the following points.

Figure 18:
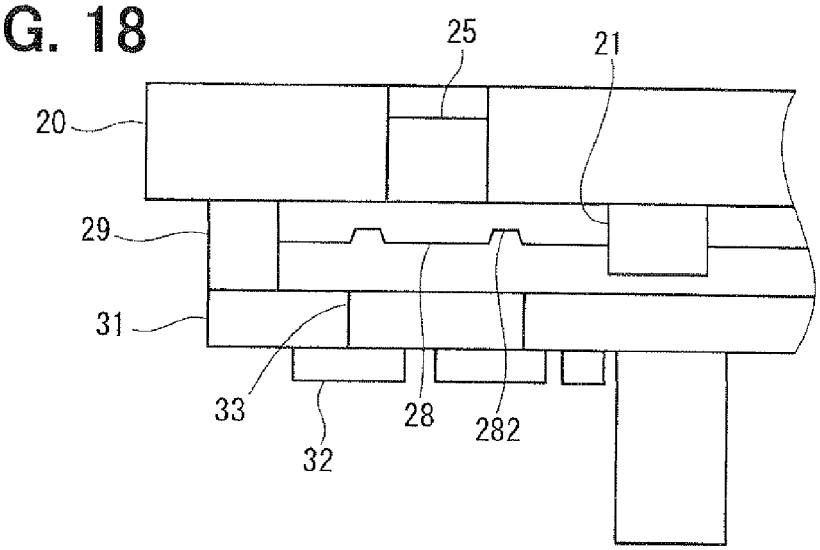
FIG. 18 is a diagram illustrating a partial side view of an electronic control apparatus according to an eighth embodiment of the present invention.

FIG. 18 illustrates the electronic control apparatus 8 from which the housing 10 and the connector 40 are detached. As can be seen from FIG. 18, the substrate 31 has a through hole 33. It is preferable that the through hole 33 should be located at a position corresponding to the hook receiver 25. For example, the through hole 33 can be located directly below the hook receiver 25. It is preferable that the width of the through hole 33 should be greater than the width of the hook 11. For example, the thorough hole 33 can have the width of from about 13 millimeters to about 15 millimeters and the depth of from about 2 millimeters to about 3 millimeters.

Further, as shown in FIG. 18, the fitting portion 28 has a pair of guiding projections 282 (as a drip guiding portion) for defining a recess. The recess defined by the guiding projections 282 is located between the hook 11 and the through hole 33 in a direction perpendicular to a surface of the substrate 31. It is preferable that the guiding projection 282 should be located between a line passing through an edge of the hook 11 and a line passing through an edge of the through hole 33 in the direction perpendicular to the surface of the substrate 31. Further, it is preferable that each end of the recess defined by the guiding projections 282 does not overlap the substrate 31 in the direction perpendicular to the surface of the substrate 31. In other words, it is preferable that each end of the recess defined by the guiding projections 282 should be located in the through hole 33 or located outside of an edge of the substrate 31 in the direction perpendicular to the surface of the substrate 31.

Figure 19:
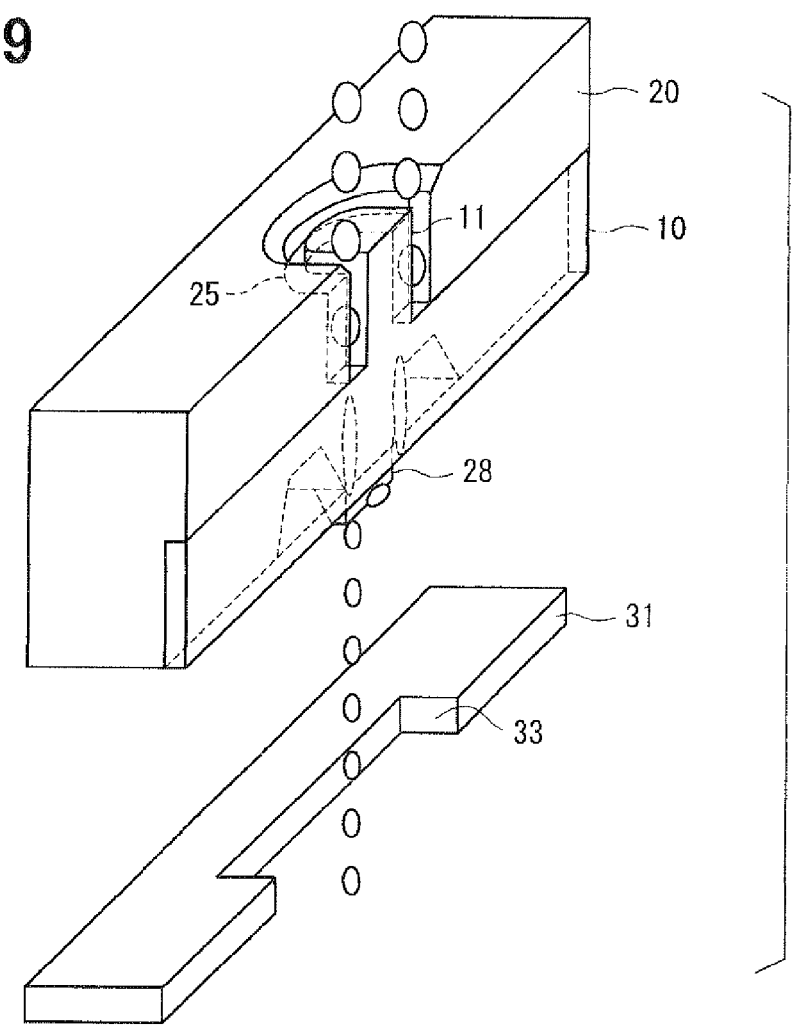
FIG. 19 is a diagram illustrating a partial perspective view of the electronic control apparatus according to the eighth embodiment of the present invention.

FIG. 19 shows a partial view illustrating an area near the through hole 33 of the substrate 31. As shown in FIG. 19, the through hole 33 prevents the liquid entering the electronic control apparatus 8 through the hook 11 and the hook receiver 25 from falling on the substrate 31. In this way, the electronic control apparatus 8 according to the eighth embodiment has a simple structure for achieving high waterproof performance. Further, the fitting portion 28 has the guiding projections 282 for defining the recess. The liquid can be surely guided to the through hole 33 by locating the guiding projection 282 between the line passing through the edge of the hook 11 and the line passing through the edge of the through hole 33 in the direction perpendicular to the surface of the substrate 31.

Modifications

The embodiments described above can be modified in various ways, for example, as follows.

In the embodiments, the electronic control apparatus is mounted in such a manner that the lid 20 is located above the housing 10 in the vertical direction, and the outer surface of the lid 20 has the liquid drip area 100. Alternatively, the electronic control apparatus can be mounted in such a manner that the bottom 13 of the housing 10 is located above the lid 20 in the vertical direction, and the outer surface of the bottom 13 of the housing 10 can have the liquid drip area 100. In this case, the isolation member such as the flow path portion, the guiding portion, and the isolation wall is located on the outer surface of the bottom 13 of the housing 10.

In the embodiments, the outer surface where the liquid drip area 100 is located is provided with two flow path portions. Alternatively, the outer surface where the liquid drip area 100 is located can be provided with three or more flow path portions. For example, the outer surface where the liquid drip area 100 is located can be provided with five flow path portions for individually surrounding the connector and the four hook receivers. In this case, the guiding slot can be provided between the flow path portions.

In the embodiments, the fitting portion has a taper shape. Alternatively, the fitting portion can have a shape other than a taper shape, as long as the fitting portion can guide the liquid to the screw receiver-side from the hook receiver-side. For example, the fitting portion can have a rod shape extending from a back surface of the hook receiver to the screw receiver. In this case, it is preferable that the fitting portion should be located near the controller at the screw receiver-side rather than the hook receiver-side.

In the embodiments, the fitting portion has the guiding projection for defining a recess. Alternatively, the fitting portion has a guiding recess for defining a projection.

Such changes and modifications are to be understood as being within the scope of the present invention as defined by the appended claims.

What is claimed is:

1. An electronic control apparatus comprising:
a hollow housing with an opening and a bottom, the bottom having a first inner surface located inside the housing and a first outer surface opposite to the first inner surface;
a lid that covers the opening of the housing to form closed space defined by the lid and the housing, the lid having a second inner surface located facing the first inner surface and a second outer surface opposite to the second inner surface;
a fastener that fixes the lid to the housing; and
a controller located in the space, wherein
one of the first outer surface and the second outer surface is provided with an isolation member,
the one of the first outer surface and the second outer surface has a liquid drip area where liquid is expected to drip,
the isolation member causes the liquid dripped on the liquid drip area to flow down the one of the first outer surface and the second outer surface in a predetermined flow direction in such a manner that the liquid avoids the fastener,
the isolation member has a flow path portion located between the liquid drip area and the fastener,
the flow path portion projects from the one of the first outer surface and the second outer surface in a direction perpendicular to the one of the first outer surface and the second outer surface, and
a first end of the flow path portion is located above a second end of the flow path portion in the flow direction, wherein
the fastener comprises a plurality of fasteners, and
a first number of the plurality of fasteners is located above the flow path portion in the flow direction,
a second number of the plurality of fasteners is located below the flow path portion in the flow direction, and
the second number is greater than the first number.

2. The electronic control apparatus according to claim 1, wherein
the second end of the flow path portion is located below an upper edge of the fastener in the flow direction.

3. The electronic control apparatus according to claim 1, further comprising:
a connector located at a lower edge of the housing in the flow direction and electrically connected to the controller, wherein
the second end of the flow path portion is located closer to a center of the connector than the first end of the flow path portion.

4. The electronic control apparatus according to claim 1, wherein
the isolation member has a guiding portion located below the flow path portion in the flow direction.

5. The electronic control apparatus according to claim 4, wherein
a first end of the guiding portion is located above a second end of the guiding portion in the flow direction.

6. The electronic control apparatus according to claim 5, further comprising:
a connector located at a lower edge of the housing in the flow direction and electrically connected to the controller, wherein
the second end of the guiding portion is located closer to a center line of the connector than the second end of the liquid flow portion.

7. The electronic control apparatus according to claim 1, wherein
the isolation member includes an outline portion extending along an outline of the fastener.

8. The electronic control apparatus according to claim 7, wherein
the outline portion is an isolation wall that is separated from the fastener by a predetermined distance.

9. The electronic control apparatus according to claim 1, further comprising:
a surrounding wall standing on the one of the first outer surface and the second outer surface and extending along a periphery of the one of the first outer surface and the second outer surface.

10. The electronic control apparatus according to claim 9, wherein
the surrounding wall has a plurality of slits for discharging the liquid.

11. The electronic control apparatus according to claim 1, wherein
the lid has a fitting portion fitted in the housing, and
the fitting portion is located on the second inner surface and has a taper shape for guiding the liquid entering the space to a predetermined region in the space.

12. The electronic control apparatus according to claim 11, wherein
the controller includes a substrate and an electronic device mounted on the substrate, and
an outer wall of the fitting portion is located closer to an inner side wall of the housing than an edge of the substrate.

13. The electronic control apparatus according to claim 12, wherein
the substrate has a through hole at a position corresponding to the fastener,
the fitting portion has a drip guiding portion at a position corresponding to each side of the hook, and
each end of the drip guiding portion does not overlap the substrate in a direction perpendicular to the substrate.

14. The electronic control apparatus according to claim 11, wherein
a tip of the fitting portion has a protrusion, and
the protrusion is located closer to an inner side wall of the housing than an edge of the substrate.

15. The electronic control apparatus according to claim 11, wherein
an inner side wall of the housing has a recess and a projection, and
the recess and the projection are located facing an outer wall of the fitting portion.

16. An electronic control apparatus comprising:
a hollow housing with an opening and a bottom, the bottom having a first inner surface located inside the housing and a first outer surface opposite to the first inner surface;
a lid that covers the opening of the housing to form closed space defined by the lid and the housing, the lid having a second inner surface located facing the first inner surface and a second outer surface opposite to the second inner surface;
a fastener that fixes the lid to the housing; and
a controller located in the space, wherein
one of the first outer surface and the second outer surface is provided with an isolation member,
the one of the first outer surface and the second outer surface has a liquid drip area where liquid is expected to drip,
the isolation member causes the liquid dripped on the liquid drip area to flow down the one of the first outer surface and the second outer surface in a predetermined flow direction in such a manner that the liquid avoids the fastener,
the isolation member has a flow path portion located between the liquid drip area and the fastener,
the flow path portion projects from the one of the first outer surface and the second outer surface in a direction perpendicular to the one of the first outer surface and the second outer surface, and
a first end of the flow path portion is located above a second end of the flow path portion in the flow direction, wherein
the one of the first outer surface and the second outer surface is provided with a plurality of fixing members for fixing the electronic control apparatus to an object, wherein
the plurality of fixing members is arranged symmetrically with respect to a center of the one of the first outer surface and the second outer surface,
each of the plurality of fixing members has a base portion and a mounting portion,
the base portion is joined to the housing or the lid,
the mounting portion is configured to be fixed to the object, and
the base portion and the flow path portion are integrally formed in such a manner that the flow path portion extends continuously from the base portion.

17. The electronic control apparatus according to claim 16, wherein
the plurality of fixing members is located above the fastener in the flow direction,
the plurality of fixing members projects from the one of the first outer surface and the second outer surface in a direction perpendicular to the one of the first outer surface and the second outer surface, and
a height of the plurality of fixing members from the one of the first outer surface and the second outer surface is greater than a height of the plurality of fixing members from the one of the first outer surface and the second outer surface.

18. The electronic control apparatus according to claim 16,
the fastener includes a hook swaged to the lid,
the hook and the housing are integrally formed as a single piece,
the second outer surface of the lid has the liquid drip area, and
one end of the base portion is located closer to the liquid drip area than the hook.

* * * * *